(12) United States Patent
Yamazawa

(10) Patent No.: US 8,632,956 B2
(45) Date of Patent: Jan. 21, 2014

(54) PROCESS FOR PRODUCING PHOTOSENSITIVE RESIN PLATE AND RELIEF PRINTING PLATE HAVING RECESSED AND PROJECTED PATTERN, AND PLATE SURFACE TREATING LIQUID USED IN THE PROCESS

(75) Inventor: Kazuyoshi Yamazawa, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 561 days.

(21) Appl. No.: 12/532,060

(22) PCT Filed: Mar. 12, 2008

(86) PCT No.: PCT/JP2008/054537
§ 371 (c)(1),
(2), (4) Date: Sep. 18, 2009

(87) PCT Pub. No.: WO2008/126606
PCT Pub. Date: Oct. 23, 2008

(65) Prior Publication Data
US 2010/0143846 A1    Jun. 10, 2010

(30) Foreign Application Priority Data

Mar. 20, 2007 (JP) .................................. 2007-073249

(51) Int. Cl.
*G03F 7/00* (2006.01)
*G03F 7/26* (2006.01)

(52) U.S. Cl.
USPC ........ 430/306; 430/269; 430/270.1; 430/300; 430/309

(58) Field of Classification Search
USPC ....................................... 430/306
See application file for complete search history.

(56) References Cited

U.S. PATENT DOCUMENTS

| | | | |
|---|---|---|---|
| 4,478,885 A | 10/1984 | Kuramoto | |
| 4,925,775 A | 5/1990 | Hoffmann | |
| 5,250,389 A | 10/1993 | Nakamura et al. | |
| 5,288,571 A | 2/1994 | Nakamura et al. | |
| 5,688,309 A | 11/1997 | Shimada et al. | |
| 6,558,869 B1 * | 5/2003 | McCullough et al. | 430/270.1 |
| 7,029,825 B2 | 4/2006 | Yokota et al. | |
| 7,754,415 B2 * | 7/2010 | Yamada et al. | 430/300 |
| 2004/0157162 A1 | 8/2004 | Yokota et al. | |
| 2007/0160928 A1 * | 7/2007 | Yamada et al. | 430/270.1 |
| 2007/0160933 A1 * | 7/2007 | Onoda | 430/302 |

FOREIGN PATENT DOCUMENTS

| | | | | |
|---|---|---|---|---|
| EP | 0 539 227 A1 | | 4/1993 | |
| JP | 51-40206 | | 4/1976 | |
| JP | 52-13904 | | 2/1977 | |
| JP | 53-3759 | | 2/1978 | |
| JP | 53-003759 B | * | 2/1978 | |
| JP | 59-14744 | | 4/1984 | |
| JP | 59-138454 | | 8/1984 | |
| JP | 60-191238 A | | 9/1985 | |
| JP | 62-95310 | | 5/1987 | |
| JP | 63-88555 | | 4/1988 | |
| JP | 63-163466 | | 7/1988 | |
| JP | 5-134410 | | 5/1993 | |
| JP | 6-186740 | | 7/1994 | |
| JP | 06-186740 A | * | 7/1994 | |
| JP | 8-244370 | | 9/1996 | |
| JP | 9-95516 | | 4/1997 | |
| JP | 9-244225 | | 9/1997 | |
| JP | 10-171111 A | | 6/1998 | |
| JP | 10-217418 | | 8/1998 | |
| JP | 2002-292985 A | | 10/2002 | |
| JP | 2005-084418 A | | 3/2005 | |
| JP | 2005084418 A | * | 3/2005 | G03F 7/40 |
| JP | 2005-212144 A | | 8/2005 | |
| WO | WO-03/022594 A1 | | 3/2003 | |
| WO | WO-2005/064413 A1 | | 7/2005 | |
| WO | WO 2005064413 A1 | * | 7/2005 | G03F 7/32 |

OTHER PUBLICATIONS

International Preliminary Report on Patentability dated Oct. 1, 2009.

* cited by examiner

*Primary Examiner* — Chanceity Robinson
(74) *Attorney, Agent, or Firm* — Finnegan, Henderson, Farabow, Garrett & Dunner, L.L.P.

(57) ABSTRACT

The present invention provides a process for producing a photosensitive resin plate or relief printing plate having a recessed and projected pattern, which comprises the steps of: making a liquid containing an ink-repellent component (A) and a curing component (B) attach to the plate surface of the photosensitive resin plate or relief printing plate having a recessed and projected pattern prior to the post-treatment step or during the post-treatment step, wherein the ink-repellent component (A) comprises at least one compound selected from the group consisting of silicon-based compounds, fluorine-based compounds and paraffin-based compounds, and provides a treatment liquid which is suitable for the process for producing the photosensitive resin plate or the relief printing plate having the recessed and projected pattern.

16 Claims, No Drawings

PROCESS FOR PRODUCING PHOTOSENSITIVE RESIN PLATE AND RELIEF PRINTING PLATE HAVING RECESSED AND PROJECTED PATTERN, AND PLATE SURFACE TREATING LIQUID USED IN THE PROCESS

TECHNICAL FIELD

The present invention relates to a process for producing a photosensitive resin plate having a recessed and projected pattern (hereinafter referred to merely as "photosensitive resin plate") and a relief printing plate having the pattern, and more specifically relates to a process for producing a photosensitive resin plate and a relief printing plate which are suitable for: forming a relief image for a flexographic printing plate/a letter press printing plate/a stamp plate; forming a surface-finished pattern such as embossing finish; forming a profiling pattern; forming patterns of a conductor/a semiconductor/an insulator, in an electric component; forming a pattern of a functional material such as an anti-reflection film, a color filter and a (near) infrared cut filter, in an optical component; forming coatings/patterns of an oriented film, an underlayer, a light-emitting layer, an electron transport layer and a sealing layer, in the production of a display device such as a liquid crystal display and an organic electro luminescence display; and a blanket for ink transfer, which does not have a pattern formed thereon, or a roll for adjusting the quantity of an ink while contacting an anilox roll.

BACKGROUND ART

There are various printing systems, in general, such as relief printing (flexographic printing, letter press or the like)/gravure printing (intaglio)/offset printing (lithographic plate). Among them, the relief printing method is an easy printing system, can print information on various printing media at low cost, can also easily print information at a high speed, and accordingly has been weighted heavily among recent printing methods. In addition, in recent years, the flexographic printing, which is used particularly for a packaging material such as a corrugated cardboard, a paper container, a paper bag and a soft film for packaging, an architectural material such as a wall paper and a decorative laminate, label printing and the like, has higher definition and higher versatility among various relief printing methods, and has received attention. A general relief printing plate is produced through an exposing step, a developing step and a post-treatment step, and often employs a photosensitive resin as is described in Patent Documents 1 to 3, for instance. The relief printing method also includes a method for directly forming a relief image on an original printing plate with a laser beam, which does not need the developing step. The material to be used for the above method includes a plate made by heating/vulcanizing a synthetic rubber such as EPDM and a silicone, and a plate obtained by photo-curing a photosensitive resin by light exposure, as is described in Patent Document 4.

The photosensitive resin plate can be applied to various applications not only for the relief printing plate but also for forming a pattern with the use of a designed roll by surface finish such as embossing finish, forming a profiling pattern, for forming patterns of a conductor/a semiconductor/an insulator, in an electric component, for forming a pattern of a functional material such as an anti-reflection film, a color filter and a (near) infrared cut filter, in an optical component, further for forming coatings/patterns of an oriented film, an underlayer, a light-emitting layer, an electron transport layer and a sealing layer, in the production of a display device such as a liquid crystal display and an organic electro luminescence display, for a blanket for ink transfer, which does not have a pattern formed thereon, or for a roll for adjusting the quantity of an ink while contacting an anilox roll.

For instance, a printing method with the use of a flexographic printing plate is a method in which ink is supplied onto the surface of the projecting part in a printing plate having recessed and projected portions by using an ink supply roll or the like, and subsequently the printing plate is brought into contact with a substrate to transfer the ink on the surface of the projecting part onto the substrate. In such a flexographic printing method, the ink often attaches to a shoulder part of the projecting part of the printing plate in a long printing period of time, or the ink enters the recessed parts of the printing plate (hereinafter referred to as "plate surface blemish"). As a result, there is a case where even a portion which is not contained in an original design is printed. In such a case, it is necessary to stop printing once, and to wipe off the unnecessary ink of an image of the printing plate with a cloth or the like by using a cleaning liquid such as alcohol, which becomes economically disadvantageous.

Particularly in recent years, the relief printing method has a trend of being applied to high-definition printing, and the printed matter is required to show no irregularity of dots, the uniformity of widths of a character, a thin line or a reverse line, and the uniformity of the concentration of a solid part. When the ununiform irregularity and the blemish are formed on the surface of the plate, the irregularity can be transferred onto the printed matter.

Similar problems occur also when a pattern is formed with the use of a photosensitive resin plate. The deterioration of the uniformity of the pattern and the pattern blemish due to the plate surface blemish may lead to the aggravation of the releasability of a body to be contacted or a mold, particularly when a surface-finished pattern by embossing finish or the like and a profiling pattern are formed.

Various methods are proposed for preventing the plate surface blemish of a printing plate. Patent Document 5 discloses a technology of making an organofluoric compound attach to the surface of the plate with a brush coating method or a spray coating method.

Patent Document 6 discloses a method in which a material selected from among a silane coupling agent, silicone oil and silicone grease is added to the inner part of a photosensitive resin, and then the material is made migrate to the surface of the photosensitive resin.

Patent Document 7 proposes a method in which a mixture of a water-based emulsion of a silicon-based compound or a fluorine-based compound and an aqueous resin is applied to the surface of the plate.

Patent Document 8 proposes a method in which a hydrophobic compound which is copolymerizable with a polymerizable material in a water-developable composition and contains fluorine, chlorine and silicon is added to the inner part of the composition, and the contact angle of the surface of the plate is increased.

Patent Document 9 proposes a method for producing a photosensitive resin plate, which includes making a solution containing a silicon-based compound and/or a fluorine-based compound attach to a plate surface prior to the post-exposure step, in order to prevent the plate surface blemish for a long period of time.

Patent Document 10 proposes a method in which a water-developing photosensitive resin plate for relief printing is brought into contact with a liquid containing a modified silicone compound or a modified fluorine compound, after an exposure step in a plate making process.

Patent Document 11 proposes a method for producing a laser-engraved printing plate, which includes a step of immersion in a treatment liquid containing an organosilicon compound having a number average molecular weight of 100 or more but 100,000 or less, or a step of post-exposure to a laser beam having a wavelength of 200 nm or more but 450 nm or less after application of the treatment liquid.

Furthermore, a technology is also known which makes a paraffin wax (waxy hydrocarbon) contained in a resin composition and bleed onto the surface of the printing plate, as is described in Patent Document 12.

Patent Document 1: Japanese Patent Laid-Open Publication No. 10-171111
Patent Document 2: Japanese Patent Laid-Open No. 63-088555
Patent Document 3: Japanese Patent Laid-Open No. 05-134410
Patent Document 4: Leaflet of WO 03/022594
Patent Document 5: Japanese Patent Laid-Open No. 51-40206
Patent Document 6: Japanese Patent Laid-Open No. 60-191238
Patent Document 7: Japanese Patent Laid-Open No. 2002-292985
Patent Document 8: Japanese Patent Laid-Open No. 06-186740
Patent Document 9: Japanese Patent Laid-Open No. 2005-84418
Patent Document 10: Leaflet of WO 05/064413
Patent Document 11: Japanese Patent Laid-Open No. 2005-212144
Patent Document 12: Japanese Patent Laid-Open No. 62-95310

DISCLOSURE OF THE INVENTION

Problems to be Solved by the Invention

However, it has been difficult to prevent an ink blemish on a plate surface for a long period of time without exerting a harmful influence on printing and patterning by the conventionally proposed method as well.

For instance, in the method described in Patent Document 5, since application is performed after a post-exposure step, an effect of preventing a plate surface blemish is small and lasts for shot period of time. It is difficult for these effects to continue particularly in a long run or in repetitive printing, so that the method requires repeated application in order to retain the effects and consequently increases operations and costs.

The method described in Patent Document 6 is a method for preventing a scratch due to a plate making operation and the like, and basically making a silicon compound bleed. In addition, there is no description on a post-exposure step in Patent Document 6, so that the compound is removed from the surface in printing, and it cannot be expected at all for the silicon compound to sustain the hydrophobic effect on the surface.

According to the method described in Patent Document 7, the aqueous solution has a low penetrating power and is applied after the post-exposure, so that the method does not necessarily show a sufficient effect of preventing the plate surface blemish.

The method described in Patent Document 8 is excellent because the hydrophobicity of the plate surface is fixed on a resin by the copolymerization between the hydrophobic compound and a component of the photosensitive resin. However, an applicable resin is limited to a liquid or pasty uniform resin such as a polyurethane-based resin, a polyvinyl alcohol-based resin, a polyester-based resin or a nylon-based resin, which is mentioned in the specification of the Document as well. If such a technology is applied to a resin system which is prepared by mixing and dispersing a polar-group-containing polymer and a hydrophobic polymer, and which particularly gives durability to the plate among water-developing photosensitive resins and can form a plate surface with high definition, when a fluorine compound or a silicone compound is added to the resin system prepared by mixing and dispersing the polar-group-containing polymer and the hydrophobic polymer, the fluorine compound or the silicone compound would bleed from the resin or form cloud in the plate, which would consequently cause the inconvenience of causing the scattering of light in a light exposure step. Then, image reproducibility is aggravated. For instance a thin line is poorly formed or a shape of dots is poorly formed. Even if a print was made by using such a printing plate, the print would show irregularity and the ununiformity of a thin line, a character and the like, and a printed matter with high definition could not be obtained. In addition, when the addition of the hydrophobic compound is in a level of inhibiting the image reproducibility from being aggravated as much as possible, a hydrophobic effect on the plate surface is diminished this time, and the objective is not achieved.

According to the method described in Patent Document 9, the compound does not have sufficient photoreactivity in a post-exposure step, and accordingly does not necessarily impart a sufficient sustainability of the effect of preventing the plate surface blemish.

According to the method described in Patent Document 10, the compound does not have sufficient photoreactivity in a post-exposure step, and accordingly does not necessarily impart a sufficient sustainability of the effect of preventing the blemish to the plate surface.

The printing plate which is used in the method described in Patent Document 11 does not use a thermoplastic elastomer, but uses a photosensitive resin which is in a liquid state at 20° C., and accordingly has a problem in surface curability in the atmosphere, so that the composition of the printing plate is limited. Accordingly, a solution to be applied to the printing plate so as not to swell the printing plate is limited, so that there is a concern about an influence to the print irregularity due to an application irregularity. Furthermore, according to the method, the compound does not have sufficient photoreactivity in a post-exposure step, and accordingly does not necessarily impart a sufficient sustainability of the effect of preventing the plate surface blemish.

The method described in Patent Document 12 temporarily shows an effect of preventing a plate surface blemish because a paraffin layer has ink-repellent properties, but the composition does not sufficiently cause the photoreactivity even by post-exposure, and the paraffin layer is removed from the surface in printing, so that the plate surface does not show a sufficient sustainability of the effect of preventing the plate surface blemish.

A technological object of the present invention is to provide a process for producing a photosensitive resin plate or a relief printing plate having a recessed and projected pattern, which can prevent an ink blemish of a plate surface for a long period of time and does not exert a harmful influence on printing or patterning, and to provide a treatment liquid suitable for the method.

Means for Solving the Problems

The present inventors made an extensive investigation for solving the above described problems, and as a result, found that the problem could be solved by a process in which a liquid containing an ink-repellent component (A) and a curing component (B) is made attach to the plate surface of a photosensitive resin plate or a relief printing plate having a recessed and projected pattern, and the plate is subjected to a post-treatment step, and have arrived at accomplishing the present invention. Here, the ink-repellent component (A) is at least one compound selected from the group consisting of silicon-based compounds, fluorine-based compounds and paraffin-based compounds.

In other words, a first aspect of the present invention provides:

[1] a process for producing a photosensitive resin plate or a relief printing plate having a recessed and projected pattern, which comprising the steps of: making a solution containing an ink-repellent component (A) and a curing component (B) attach to a plate surface of the photosensitive resin plate or the relief printing plate having a recessed and projected pattern; and subjecting the printing plate to post-treatment, wherein
the post-treatment step is treatment selected from the group consisting of heat treatment, post-exposure treatment with an active light source, and electron beam treatment; and
the ink-repellent component (A) comprises at least one compound selected from the group consisting of silicon-based compounds, fluorine-based compounds and paraffin-based compounds,

[2] a process for producing a relief printing plate, which comprises the steps of: making a solution containing an ink-repellent component (A) and a curing component (B) attach to a plate surface of the relief printing plate; and subjecting the printing plate to post-treatment, wherein
the post-treatment step is treatment selected from the group consisting of heat treatment, post-exposure treatment with an active light source, and electron beam treatment; and
the ink-repellent component (A) comprises at least one compound selected from the group consisting of silicon-based compounds, fluorine-based compounds and paraffin-based compounds,

[3] a process for producing a relief printing plate comprising the steps of exposing, developing and post-treating, wherein
the post-treatment step is treatment selected from the group consisting of heat treatment, post-exposure treatment with an active light source, and electron beam treatment,
further comprising making a solution containing an ink-repellent component (A) and a curing component (B) attach to the plate surface of the relief printing plate prior to the post-treatment step or during the post-treatment step, wherein
the ink-repellent component (A) comprising at least one compound selected from the group consisting of silicon-based compounds, fluorine-based compounds and paraffin-based compounds,

[4] the process according to item [2] or [3], wherein the post-treatment step is post-exposure treatment, further comprising making the solution containing the ink-repellent component (A) and the curing component (B) attach to a plate surface of the relief printing plate prior to the post-exposure treatment or in the post-exposure step, wherein the ink-repellent component (A) contains at least one compound selected from the group consisting of silicon-based compounds, fluorine-based compounds and paraffin-based compounds,

[5] the process according to any one of items [1] to [4], wherein the ink-repellent component (A) comprises the silicon-based compounds and/or the fluorine-based compounds,

[6] the process according to any one of items [1] to [4], wherein the ink-repellent component (A) comprises the fluorine-based compounds,

[7] the process according to any one of items [1] to [6], wherein the curing component (B) has at least two or more radical reactive groups in one molecule, and the radical reactive group is at least one selected from the group consisting of an allyl group, an acrylate group and a methacrylate group,

[8] the process according to any one of items [1] to [6], wherein the curing component (B) has at least 3 or more radical reactive groups in one molecule, and the radical reactive group is at least one selected from the group consisting of an allyl group, an acrylate group and a methacrylate group,

[9] the process according to any one of items [1] to [8], wherein the ink-repellent component (A) is copolymerized with the curing component (B),

[10] the process according to any one of items [1] to [8], wherein the ink-repellent component (A) comprises the fluorine-based compounds, and an equivalent weight of the radical reactive groups in the ink-repellent component (A) and the curing component (B) is 3,500 g/mol or less,

[11] the process according to any one of items [1] to [10], wherein the ink-repellent component (A) is copolymerized with the curing component (B), the curing component (B) has at least 2 or more radical reactive groups in one molecule, and an equivalent weight of the radical reactive groups in the ink-repellent component (A) and the curing component (B) is 5,000 g/mol or less,

[12] the process according to any one of items [1] to [11], wherein the ink-repellent component (A) is copolymerized with the curing component (B), the curing component (B) has at least 2 or more radical reactive groups, and the equivalent weight of the radical reactive group is 3,500 g/mol or less,

[13] the process according to any one of items [1] to [12], wherein a number average molecular weight of the ink-repellent component (A) is 5,000 or more,

[14] the process according to any one of items [1] to [13,] wherein the curing component (B) has at least 2 or more allyl groups.

[15] the process according to any one of items [1] to [14], wherein the relief printing plate comprises a block copolymer containing at least a first polymer block that mainly contains a conjugated diene and a second polymer block that mainly contains a vinyl aromatic hydrocarbon,

[16] the process according to any one of items [1] to [15], wherein the solution further comprises a radical initiator (C),

[17] the process according to any one of items [3] to [16], wherein a liquid developer in the developing step comprises a solution which contains the ink-repellent component (A) and the curing component (B),

[18] the process according to any one of items [3] to [17], wherein the developing step is a base material contact type developing step, and the base material contains the ink-repellent component (A) and the curing component (B),

[19] the process according to any one of items [3] to [18], wherein the solution containing the ink-repellent component (A) and the curing component (B) is made attach to a plate surface of the relief printing plate after the developing step and before the post-treatment step,

[20] the process according to any one of items [1] to [14], further comprising conducting a post-treatment step while bringing the solution containing the ink-repellent component (A) and the curing component (B) into contact with the relief printing plate,

[21] the process according to item [17], wherein the liquid developer comprises an organic solvent,

[22] the process according to any one of items [1] to [21], wherein the relief printing plate is a photosensitive resin plate,

[23] the process according to item [22], wherein the relief printing plate is a photosensitive resin plate for flexographic printing.

A second aspect of the present invention provides:

[24] a photosensitive resin plate or a relief printing plate having a recessed and projected pattern, which is produced by the process according to any one of items [1] to [23].

A third aspect of the present invention provides:

[25] a treatment liquid for use in a plate surface of a photosensitive resin plate or a relief printing plate having a recessed and projected pattern, which comprises an ink-repellent component (A) and a curing component (B), wherein the ink-repellent component (A) comprises at least one compound selected from the group consisting of silicon-based compounds, fluorine-based compounds and paraffin-based compounds,

[26] the treatment liquid according to item [25], wherein the curing component (B) has at least 2 or more radical reactive groups in one molecule, and the radical reactive group is at least one selected from the group consisting of an allyl group, an acrylate group and a methacrylate group,

[27] the treatment liquid according to item [25] or [26], wherein the curing component (B) has at least 3 or more radical reactive groups in one molecule, and the radical reactive group is at least one selected from the group consisting of the allyl group, the acrylate group and the methacrylate group,

[28] the treatment liquid according to any one of items [25] to [27], wherein the ink-repellent component (A) is copolymerized with the curing component (B),

[29] the treatment liquid according to any one of items [25] to [28], wherein the ink-repellent component (A) comprises fluorine-based compounds, and an equivalent weight of the radical reactive group in the ink-repellent component (A) and the curing component (B) is 3,500 g/mol or less,

[30] the treatment liquid according to any one of items [25] to [27], wherein the ink-repellent component (A) is copolymerized with the curing component (B), the curing component (B) has at least 2 or more radical reactive groups in one molecule, and an equivalent weight of the radical reactive group in the ink-repellent component (A) and the curing component (B) is 5,000 g/mol or less,

[31] the treatment liquid according to any one of items [25] to [27], wherein the ink-repellent component (A) is copolymerized with the curing component (B), the curing component (B) has at least 2 or more radical reactive groups, and the equivalent weight of the radical reactive group is 3,500 g/mol or less,

[32] the treatment liquid according to any one of items [25] to [31], wherein number average molecular weight of the ink-repellent component (A) is 5,000 or more,

[33] the treatment liquid according to any one of items [25] to [32], wherein the curing component (B) has at least 2 or more allyl groups,

[34] the treatment liquid according to any one of items [25] to [33], further comprising a radical initiator (C).

In addition, a fourth aspect of the present invention provides:

[35] a use of an ink-repellent component (A) and a curing component (B) for producing a treatment liquid for reducing an ink blemish on a plate surface of a photosensitive resin plate or a relief printing plate having a recessed and projected pattern, wherein the ink-repellent component (A) comprises at least one compound selected from the group consisting of silicon-based compounds, fluorine-based compounds and paraffin-based compounds.

Advantages of the Invention

The process according to the present invention can provide a process for producing the photosensitive resin plate or the relief printing plate which prevents an ink blemish on the plate surface of the photosensitive resin plate or the relief printing plate having the recessed and projected pattern for a long period of time, and does not exert a harmful influence on printing and patterning. In addition, the present invention can provide a treatment liquid for the photosensitive resin plate or the relief printing plate, which prevents an ink blemish on the plate surface of the photosensitive resin plate or the relief printing plate having the recessed and projected pattern for a long period of time, and does not exert a harmful influence on printing and patterning.

Best Mode for Carrying Out the Invention

The best mode for carrying out the present invention (hereinafter referred to as "present embodiment") will now be described in detail below. However, the present invention is not limited to the following embodiments, but various changes can be made within a range of the gist of the present invention.

A process according to the present embodiment will now be described while taking a photosensitive resin plate for flexographic printing as an example of a relief printing plate, but is not limited to the photosensitive resin plate at all, and can be applied to a photosensitive resin plate or a relief printing plate which is used for printing and patterning. Among them, the process is preferably used for the flexographic printing plate which has comparatively low viscosity of an ink and easily causes the plate surface blemish. The relief printing plate according to the present embodiment includes: a printing plate which forms a relief image thereon by exposing and developing a photosensitive resin (including photosensitive resin plate for flexographic printing, for instance); and a laser engraving printing plate which directly forms a relief image on a printing original plate by using a laser beam while skipping a developing step (including plate obtained by photo-curing a photosensitive resin and plate made by heating/vulcanizing a synthetic rubber, for instance). The process is preferably used particularly for the production of a photosensitive resin plate or a relief printing plate which is normally subjected to a post-exposure step so as to remove the surface tackiness.

In the photosensitive resin plate for flexographic printing to be used in the present embodiment, a resin before being exposing can be fluid at room temperature or can be solid. The photosensitive resin plate to be used for flexographic printing usually has a thickness in a range of from 0.5 to 10 mm. The photosensitive resin plate for flexographic printing to be used in the present embodiment can be a photosensitive resin plate which uses a well-known resin. The typical examples may include resins proposed in the above described Patent Document 1, Patent Document 2, Patent Document 3 and the like. The photosensitive resin plate for flexographic printing is generally constituted by an oligomer or polymer component, a polymerizable monomer component, a photoinitiator and a stabilizer. A material to be used for an oligomer or polymer component which exerts the greatest effect on physical properties of the plate is diverse, and includes various cases of using materials such as a polyurethane system, a polyvinyl alcohol system, a polyester resin system, a nylon resin system, a resin system (binder polymer) in which a polar-group-containing polymer and a hydrophobic polymer are mixed and dispersed, a hydrophobic polymer, for instance, a thermoplastic elastomer. These oligomer or polymer components may be used solely or concomitantly with one or more other components.

A preferable form of the oligomer or polymer component to be used for the photosensitive resin plate for flexographic printing to be used in the present embodiment is a thermoplastic elastomer. A more preferable form is a thermoplastic elastomer containing a copolymer of thermoplastic elastomer blocks which contains a first polymer block that mainly contains at least one conjugated diene unit (hereinafter referred to merely as "conjugated diene") and a second polymer block that mainly contains at least one vinyl aromatic hydrocarbon unit (hereinafter referred to merely as "vinyl aromatic hydrocarbon"), from the viewpoint of mold formability, a shortened plate-making period of time and an image reproducibility of printing plate. Here, the thermoplastic elastomer is a polymer which can be molded by being plasticized at high temperature and shows properties of a rubber elastic body at room temperature. Note that the above described "mainly contains" means that the polymer block contains the substance in an amount of 50 wt % or more.

A specific example of the conjugated diene is not limited to the following examples, but includes butadiene, isoprene and chloroprene, and is preferably butadiene from the viewpoint of the abrasion resistance, in particular. These monomers may be used solely or concomitantly with one or more other monomers. Hydrogen may be added to a double bond in the conjugated diene so as to further enhance solvent resistance, as needed.

A specific example of the vinyl aromatic hydrocarbon is not limited to the following examples, but includes a monomer such as styrene, p-methylstyrene, tertiary butylstyrene, α-methylstyrene, 1,1-diphenylethylene and vinyltoluene, and is preferably styrene in particular. These monomers may be used solely or concomitantly with one or more other monomers.

When the first polymer block which mainly contains the conjugated diene is, for instance, the vinyl aromatic hydrocarbon-butadiene copolymer, the vinyl aromatic hydrocarbon in the copolymer block may be uniformly or ununiformly (in tapered shape, for instance) distributed. A plurality of portions which are uniformly distributed and/or portions which are ununiformly distributed may coexist in each block. These polymers may be used solely or concomitantly with one or more other polymers.

The thermoplastic elastomer may be concomitantly used with a styrene-ethylene-butylene block copolymer which is a conjugated diene block and is completely hydrogenated, a styrene-ethylene-propylene block copolymer or the like, as needed, in such a range as not to deviate from the object of the present invention.

The molecular weight of the thermoplastic elastomer is not limited in particular, but is preferably such a molecular weight as to be superior in balance between the mold formability and the solid maintenance properties of a photosensitive resin composition to be obtained. The preferable range of the number average molecular weight is from 80,000 to 500,000. Here, the number average molecular weight is a value obtained by measuring a sample with the use of gel permeation chromatography (GPC) and converting the result according to an authentic sample of polystyrene, of which the molecular weight is known.

The polymerizable monomer component to be used for the photosensitive resin plate for flexographic printing to be used in the present embodiment is not limited to the following polymerizable monomer components, but various well-known components can be used. The preferable form includes esters of acrylic acid, methacrylic acid, fumaric acid and maleic acid; a derivative of acrylamide or methacrylamide; an allyl ester; styrene and a derivative thereof; and an N-substituted maleimide compound. These polymerizable monomer components may be used solely or concomitantly with one or more other polymerizable monomer components.

The photoinitiator to be used for the photosensitive resin plate for flexographic printing to be used in the present embodiment is not limited to the following photoinitiators, but various well-known photoinitiators can be used. The preferable form includes various organic carbonyl compounds, and particularly includes an aromatic carbonyl compound. These photoinitiators may be used solely or concomitantly with one or more other photoinitiators. The photoinitiator may be concomitantly used with a decaying type photoinitiator and a hydrogen-abstracting type photoinitiator.

Various auxiliary additional components such as a plasticizer, a polar-group-containing polymer, a thermopolymerization inhibitor, an ultraviolet light absorber, a halation inhibitor, a light stabilizer, a surface treatment agent like silicon oil, and a photoluminescence tag (substance which is excited by external energy source and discharges obtained energy in form of light and/or radioactive rays) can be added to the photosensitive resin plate for flexographic printing to be used in the present embodiment.

An exposing step, a developing step and a post-treatment step to be used in the production of the photosensitive resin plate for flexographic printing described in the present embodiment can be conducted on a well-know condition to be used in a normal process for producing a photosensitive resin plate.

In addition, a well-known material can be used as a material of the laser engraving printing plate which directly forms a relief image on a printing original plate with the use of a laser beam, and includes a printing plate made by photo-curing a photosensitive resin which includes, for instance:

a resin made by heating/vulcanizing a synthetic rubber such as EPDM;

a resin made by thermally cross-linking thermoplastic elastomers such as a polymer block which mainly contains a conjugated diene and a polymer block which mainly contains a vinyl aromatic hydrocarbon;

a resin made by photo-curing a photosensitive resin, which is made by cross-linking thermoplastic elastomers such as a polymer block that mainly contains a conjugated diene and a polymer block which mainly contains a vinyl aromatic hydrocarbon, by ultraviolet light; and a resin such as polyurethane which is a plastomer at 20° C. and is proposed in the above described Patent Document 4.

A material particularly to be used by photo-curing the photosensitive resin is preferable from the viewpoint of the productivity of a relief printing plate and the moldability. An existing method can be used as a method for molding the photosensitive resin. For instance, a casting method, a method in which a resin is extruded from a nozzle and a dice with the use of a machine such a pump and an extruder and the thickness is adjusted using a blade and a method in which the thickness is adjusted by calendering the resin by a roller can be presented.

The molded layer of the photosensitive resin is cross-linked by irradiation with light to form a printing original plate. The photosensitive resin can also be cross-linked by irradiation with light while being molded. The light source to be used for curing can include a high-pressure mercury lamp, an ultrahigh-pressure mercury lamp, an ultraviolet-light fluorescent lamp, a germicidal lamp, a carbon arc lamp, a xenon lamp and a metal halide lamp. The light which irradiates a layer of the photosensitive resin composition preferably has a wavelength of from 200 nm to 300 nm. The light source to be used for curing can be one source, but two or more light sources may be used because the curability of the resin is occasionally enhanced by photo-curing the resin by using two or more light sources having different wavelengths.

The thickness of the relief printing plate to be used for laser engraving may be arbitrarily set according to its intended use, but is preferably 0.1 to 7 mm for the relief printing plate. In some cases, a plurality of materials having different compositions may be stacked. As for the type of the laser, there are a laser having an emission wavelength in a near infrared ray region such as a YAG laser, a fiber laser and a semiconductor laser, an infrared laser such as a carbon dioxide laser, and a visible/ultraviolet laser, for instance. In addition, the laser may be either a continuous irradiation type or a pulse irradiation type.

In the process according to the present embodiment, it is essential to make a plate surface treating liquid of the photosensitive resin plate or the relief printing plate having a recessed and projected pattern, which is a liquid containing an ink-repellent component (A) and a curing component (B), attach to the plate surface of the photosensitive resin plate or the relief printing plate having the recessed and projected pattern. The ink-repellent component (A) contains at least one compound selected from the group consisting of silicon-based compounds, fluorine-based compounds and paraffin-based compounds.

Specific examples of the silicon-based compounds in the present embodiment include, though being not limited to the following compounds, a silicone oil, a silane coupling agent, a silane compound, a silicone rubber and a silicone resin. The silicone oil means an oligomer or a polymer which mainly contains an alkylsiloxane having an alkyl group represented by a methyl group. The silicone oil is preferably used from the viewpoint of solubility to a solvent and application properties to the plate surface.

The silicone oil may be a reactive one or a non-reactive one. The silicone oil may have a radical reactive group in a molecule or may not have a radical reactive group. When the plate surface treating liquid contains a silicone oil having the radical reactive group in the molecule, in other words, when the curing component (B) is bonded to the ink-repellent component (A) through a covalent bond, the silicone oil itself contains the curing component (B) and the ink-repellent component (A), so that another curing component (B) except the curing component (radical reactive group) in the molecule of the silicone oil does not need to be added to the plate surface treatment liquid, but another curing component (B) may be added. On the other hand, when the silicone oil does not have a radical reactive group in the molecule, in other words, when the curing component (B) is not bonded to the ink-repellent component (A) through the covalent bond, the curing component (B) needs to be contained in the plate surface treating liquid. The reactive silicone oil can include, though being not limited to the following oils, methacrylic-modified, acrylic-modified, vinyl-modified, allyl-modified, hydroxyl-group-modified, epoxy-modified, carbinol-modified, carboxyl-modified, amino-modified, urethane-modified, cinnamoyl-modified, acetylene-modified, thiol-modified and oxetane-modified silicone oils. Trimethyl siloxyethyl methacrylate or the like can be also included. The non-reactive silicone oil includes polyether-modified, methylstyryl-modified, alkyl-modified, higher-fatty-ester-modified, higher-alkoxy-modified, phenyl-modified, higher-fatty-amide-modified and fluorine-modified silicone oil. A reactive silicone oil is preferred from the viewpoint of the sustainability of the effect of preventing a plate surface blemish, and a more preferable silicone oil includes methacrylic-modified, acrylic-modified, vinyl-modified and allyl-modified silicone oil having a radical reactive group in its molecule. These modification groups in the reactive silicone oil may be directly bonded to a silicon atom or may substitute for one or more hydrogen atoms in a hydrocarbon group which is bonded to the silicon atom.

Specific examples of the fluorine-based compounds in the present embodiment can include, though being not limited to the following compounds, a polyfluoroethylene compound, a poly(ethylene-ethylene fluoride) compound, an acrylic-based copolymer having a perfluoroalkyl group in a side-chain, a urethane-based polymer having a perfluoroalkyl group, an ester-based polymer having a perfluoroalkyl group and a fluorine-based monomer. The acrylic-based copolymer preferably has a perfluoroalkyl group in a side-chain from the viewpoint of the sustainability of the effect of preventing the plate surface blemish. The fluorine compound may have a radical reactive group in the molecule or may not have the radical reactive group. When the plate surface treating liquid contains the fluorine compound having the radical reactive group in the molecule, in other words, when the curing component (B) is bonded to the ink-repellent component (A) through a covalent bond, another curing component (B) except the curing component (radical reactive group) in the molecule of the fluorine compound does not need to be added to the plate surface treating liquid, but another curing component (B) may be added. On the other hand, when the fluorine-based compound does not have the radical reactive group in the molecule, in other words, when the curing component (B) is not bonded to the ink-repellent component (A) through the covalent bond, the curing component (B) needs to be contained in the plate surface treating liquid.

Specific examples of the paraffin-based compounds in the present embodiment can include, though being not limited to the following compounds, a paraffin oil, a paraffin wax and a microcrystallin wax. The paraffin-based compound may have a radical reactive group in the molecule or may not have the radical reactive group. When the plate surface treating liquid contains the paraffin-based compound having the radical reactive group in the molecule, in other words, when the curing component (B) is bonded to the ink-repellent component (A) through a covalent bond, another curing component (B) except the curing component (radical reactive group) in the molecule of the paraffin-based compound does not need to be added, but another curing component (B) may be added. On the other hand, when the paraffin-based compound does not have the radical reactive group in the molecule, in other words, when the curing component (B) is not bonded to the ink-repellent component (A) through the covalent bond, the curing component (B) needs to be contained in the plate surface treating liquid.

The ink-repellent component (A) may employ the above described silicon-based compounds, fluorine-based compounds and paraffin-based compounds solely or concomitantly with one or more of the above compounds. The ink-repellent component (A) is preferably the silicon-based compound and/or the fluorine-based compound from the viewpoint of application properties.

The number average molecular weight of the ink-repellent component (A) is preferably 5,000 or more from the viewpoint of the sustainability of the effect of preventing the plate surface blemish, and is preferably 50,000 or less from the viewpoint of the application properties. The number average molecular weight is more preferably 5,000 or more but 30,000 or less. Here, the number average molecular weight is a value obtained by measuring a sample with the use of gel permeation chromatography (GPC) and converting the result based on an authentic sample of polystyrene, of which the molecular weight is known.

The curing component (B) in the present embodiment means a component having a functional group (hereinafter referred to merely as "radical reactive group") or a compound, which causes reaction/curing by a radical. A specific radical reactive group includes, though being not limited to the following groups and compounds, a methacrylic group, an acrylic group, a vinyl group, an allyl group and a thiol group, and a maleimide compound and a cyclic ketene acetal as a compound. The radical reactive group preferably contains two or more methacrylic groups, acrylic groups, vinyl groups and allyl groups in one molecule, from the viewpoint of sustainability of the effect of preventing the plate surface blemish, and the allyl group is more preferable. The curing component (B) has a radical reactive group which more preferably contains three or more methacrylic groups, acrylic groups, vinyl groups and allyl groups in one molecule. The curing component (B) may be used solely or concomitantly with one or more other curing components. The curing component (B) may be bonded to an ink-repellent component (A) by a covalent bond, or may not be bonded. The curing component (B) is preferably bonded by the covalent bond from the viewpoint of the sustainability of the effect of preventing the plate surface blemish.

When the curing component (B) is not bonded to the ink-repellent component (A) through the covalent bond, a site which is bonded with a reactive group includes, though being not limited in particular, a hydrocarbon skeleton, an oxygen-containing skeleton and a nitrogen-containing skeleton, and specifically includes, a derivative of acrylamide or methacrylamide, styrene and a derivative thereof, and an N-substituted maleimide compound, for instance. A more specific compound includes, though being not limited to the following compounds, diallyl sebacate, triallyl isocyanurate, triallyl cyanurate, trimethylolmelamine, N,N'-hexamethylene bis-methacrylamide, a triazine derivative, triallyl trimellitate, an oxazole-based derivative, an imidazole-based derivative, a thiazole-based derivative, a blocked isocyanate compound, a melamine resin compound, a glyoxal-based resin compound and a urea resin compound.

The curing component (B) preferably has at least two or more reactive groups in one molecule from the viewpoint of the sustainability of the effect of preventing the plate surface blemish. The equivalent weight of the radical reactive group is preferably 5,000 g/mol or less, and more preferably is 3,500 g/mol or less. Here, the equivalent weight of the radical reactive group means a weight (g/mol) of a radical reactive group contained in the ink-repellent component (A) and the curing component (B), and can be measured by a $^{1}$H-NMR or $^{13}$C-NMR of a nuclear magnetic resonance apparatus (NMR).

The present embodiment adopts a post-treatment step after a treatment liquid has been attached or simultaneously when the treatment liquid is attached. Thereby, the plate surface treating liquid, which is attached to the plate surface and contains the ink-repellent component (A) and the curing component (B), strongly adheres to the plate surface. Accordingly, the effect of preventing the plate surface blemish continues for a long period of time. The post-treatment method in the production of a photosensitive resin plate and a relief printing plate to be used in the present embodiment includes: a method of treating the plate with an active light source (hereinafter referred to as "post-exposure") such as a high-pressure mercury lamp, an ultraviolet-light fluorescent lamp, a carbon arc lamp, a xenon lamp, a zirconium lamp and sunlight; a heat treatment method; and an electron beam treatment method. The post-exposure is preferable from the viewpoint particularly of the productivity/cost. The post-exposure method includes, for instance, a method in which a surface side having a recessed and projected pattern of a photosensitive resin plate or a relief printing plate is exposed in the atmosphere, and a method in which the surface side is exposed in a liquid such as water. The method in which the surface side is exposed in the atmosphere is preferable from the viewpoint of the sustainability of the effect of preventing the plate surface blemish. The heat treatment method includes, for instance, a method in which the photosensitive resin plate or the relief printing plate is heated with the use of a heater or an infrared heater, or the plate is placed into a heating oven. A heating temperature in the surface side having a recessed and projected pattern is preferably 40 to 130° C. from the viewpoint of solid-keeping properties of the obtained photosensitive resin plate or the relief printing plate, and more preferably is 70 to 100° C. The heating time is not limited in particular, but is preferably short from the viewpoint of the productivity. The electron beam treatment method includes a method in which the surface side having a recessed and projected pattern of the photosensitive resin plate or the relief printing plate is treated with the use of a high-energy electron-beam irradiation device of from 10 to 5 MeV, a middle-energy electron-beam irradiation device of from 5 MeV to 300 keV and a low-energy electron-beam irradiation device of less than 300 keV. The method in which the surface side is treated with the use of the low-energy electron-beam irradiation device is preferable from the viewpoint of a low cost. The post-treatment step can also employ two or more steps. In the case of such an embodiment, it is sufficient to conduct at least one post-treatment step among the post-treatment steps after the plate surface treating liquid has been attached or simultaneously while the treatment liquid is attached to the plate. For instance, it is also possible to conduct post-exposure treatment, subsequently attach the plate surface treating liquid to the plate, and then conduct the heat treatment. Furthermore, it is also possible to conduct simultaneously two or more post-treatment steps. For instance, it is possible to conduct the post-exposure treatment in a heating heater, and conduct the heat treatment and the post treatment simultaneously by using a lamp which irradiates a large amount of infrared rays and ultraviolet rays as well.

In addition, a radical initiator (C) may be contained in a solution containing the ink-repellent component (A) and the curing component (B), or may be contained in a photosensitive resin plate and a relief printing plate to which a solution is to be attached. The radical initiator is an initiator which produces a radical in the above described post-treatment step, and includes a photoinitiator which produces a radical by an active light source, or a thermal initiator which produces a radical by heat. The radical initiator is not indispensable during the post-treatment step with the use of an electron beam, but may be included therein.

Various well-known photoinitiators can be used for the photoinitiator, but various organic carbonyl compounds are preferable, and an aromatic carbonyl compound is particularly preferable. Specific examples of the photoinitiator can include: though being not limited to the following compounds, benzophenone; 4,4-bis(diethylamino)benzophenone; t-butyl anthraquinone; 2-ethyl anthraquinone; thioxanthones such as 2,4-diethyl thioxanthone, isopropyl thioxanthone and 2,4-dichlorothioxanthone; acetophenones such as diethoxyacetophenone, 2-hydroxy-2-methyl-1-phenylpropane-1-one, benzyl dimethyl ketal, 1-hydroxycyclohexyl-phenyl ketone, 2-methyl-2-morpholino(4-thiomethyl phenyl)propane-1-one and 2-benzyl-2-dimethylamino-1-(4-morpholinophenyl)-butanone; benzoin ethers such as benzoin methyl ether, benzoin ethyl ether, benzoin isopropyl ether and benzoin isobutyl ether; acyl phosphine oxides such as 2,4,6-trimethyl benzoyl diphenyl phosphine oxide, bis(2,6-dimethoxybenzoyl)-2,4,4-trimethyl pentyl phosphine oxide and bis(2,4,6-trimethyl benzoyl)-phenyl phosphine oxide; methyl benzoyl formate; 1,7-bisacridinyl heptane; and 9-phenyl acridine. These may be used solely or concomitantly with one or more other photoinitiators.

Various well-known thermal initiators can be used for the thermal initiator, but compounds such as an azo compound and peroxides are preferable. It is preferable to use the photoinitiator from the viewpoint of the productivity/cost.

A liquid containing the ink-repellent component (A) and the curing component (B) in the present embodiment may be used after having been dissolved in a solvent, or may be used alone when it is liquid at 20° C. The liquid is preferably used after having been dissolved in a solvent from the viewpoint of application properties to the plate surfaces of the photosensitive resin plate and the relief printing plate. The solvent preferably penetrates to the periphery of the surfaces after having been attached to the plate surfaces of the photosensitive resin plate and the relief printing plate. The liquid is used during the post-treatment step after such a solvent as to penetrate to the plate surfaces of the photosensitive resin plate and the relief printing plate has been selected, so that the ink-repellent component (A) more strongly adheres to the surface (periphery) of the resin, which is preferable. It is particularly preferable to use a solvent which mainly contains an organic solvent, because the organic solvent has a higher penetrating power than water. The word "mainly contains" used here means that a substance is contained in an amount of 50 wt % or more. A usable solvent having the higher penetrating power than water is not limited to the following solvents, but specifically can include solvents such as hydrocarbons, acetic acid esters, alcohols, ketones and glycol ethers. These solvents may be used solely or concomitantly with one or more other solvents. In order to make the liquid penetrate to the plate surface of the photosensitive resin plate and the relief printing plate, the solvent to be used can contain water and concomitantly paraffin or glycol ethers, which are the above described solvent, or can contain water and a nonionic-based surface active agent of an additive having a high penetrating power. Additives such as antifoaming agents, oxidation inhibitors and antiseptic agents may be added to the liquid containing the ink-repellent component (A) and the curing component (B), as needed.

In addition, in the present embodiment, an exposure system to be used in the production of the photosensitive resin plate for flexographic printing may be the well-known method. The exposure light source includes a high-pressure mercury lamp, an ultraviolet-light fluorescent lamp, a carbon arc lamp, a xenon lamp, a zirconium lamp or sunlight. The intensity of the light in exposure is not limited in particular, but is 3 to 70 mW/cm$^2$, for instance. The exposure intensity measured at this time is a numeric value obtained by using a UV-35 filter in a UV illuminance meter MO-2 type instrument made by ORC MANUFACTURING CO., LTD.

In addition, in the present embodiment, an exposure system of post-exposure in a post-treatment step of the photosensitive resin plate for flexographic printing may be the well-known method. The exposure light source includes a high-pressure mercury lamp, an ultraviolet-light fluorescent lamp, a carbon arc lamp, a xenon lamp, a zirconium lamp and sunlight. The intensity of the light in exposure is not limited in particular, but is 1 to 50 mW/cm$^2$, for instance. The exposure intensity measured at this time is a numeric value obtained by using a UV-25 filter in a UV illuminance meter MO-2 type instrument made by ORC MANUFACTURING CO., LTD.

In the present embodiment, the exposure light source to be used in the production of a laser engraving printing plate can include a high-pressure mercury lamp, a ultrahigh-pressure mercury lamp, an ultraviolet-light fluorescent lamp, a germicidal lamp, a carbon arc lamp, a xenon lamp and a metal halide lamp. The intensity of the light in exposure is not limited in particular, but is 1 to 50 mW/cm$^2$, for instance. The exposure intensity measured at this time is a numeric value obtained by using a UV-25 filter in a UV illuminance meter MO-2 type instrument made by ORC MANUFACTURING CO., LTD.

In addition, an exposure system of post-exposure in a post-treatment step to be used in the production of the laser engraving printing plate to be used in the present embodiment can be conducted by using the same light source as that for the above described photosensitive resin plate for flexographic printing.

The developing system to be used when development is necessary in the production of the photosensitive resin plate or the relief printing plate according to the present embodiment may be the well-known method. The developing system specifically includes:

(i) a developing system where an unexposed portion is dissolved or the unexposed portion is scratched off with the use of a brush in a state of immersing a plate in a liquid developer;

(ii) a developing system where an unexposed portion is dissolved or the unexposed portion is scratched off with the use of a brush while sprinkling a liquid developer onto a plate surface with a spray or the like;

(iii) a system where a resin is heated at 40 to 200° C. and thereby a base material such as a non-woven fabric is made absorb the resin; and (iv) a system where an unexposed portion is scratched off by the shearing force with the use of a gas or a fluid. In the developing system in the production of the photosensitive resin plate according to the present embodiment, each of the above described systems may be conducted solely or concomitantly with one or more other systems. When the liquid developer is used, the liquid developer includes a water-based liquid developer containing an organic solvent and a surface active agent, for instance.

A usable organic solvent is not limited to the following solvents, but includes: esters such as heptyl acetate and 3-methoxybutyl acetate; hydrocarbons such as petroleum distillate, toluene and decalin; and a solvent which is a mixture of a chloride-based organic solvent such as tetrachloroethylene with an alcohol such as propanol, butanol and pentanol. A preferable solvent is a hydrocarbon from the viewpoint of developing properties.

The water-based liquid developer containing a surface active agent is not limited to the following liquid developers, but includes a liquid developer containing at least one or more of nonionic surface active agents, anionic surface active agents, cationic surface active agents and amphoteric surface active agents, and is preferably a water-based liquid developer containing a nonionic surface active agent or an anionic-based surface active agent from the viewpoint of developing properties.

It is possible to use a liquid developer to which the silicon-based compounds, the fluorine-based compounds or the paraffin-based compounds has been added, in place of a step of attaching or applying a liquid containing an ink-repellent component (A) and the curing component (B) to the plate surface of the photosensitive resin plate.

When the developing step is a contact type developing step with a base material of a non-woven fabric or the like, it is also reasonable to make the non-woven fabric contain the liquid containing the ink-repellent component (A) and the curing component (B), and use the non-woven fabric as the base material, in place of the step of attaching or applying the liquid to the plate surface of the photosensitive resin plate. When the liquid containing the ink-repellent component (A) and the curing component (B) is added to the liquid developer, the concentration of the liquid is preferably 0.01 wt % to 5 wt %.

When the liquid containing the ink-repellent component (A) and the curing component (B) is not added to the liquid developer, a method of attaching the liquid to the plate surface of the photosensitive resin plate includes: a method in which the solution is applied to the plate surface with a spray; a brush coating method; a method in which the solution is applied to the plate surface by dipping, or with a cloth or a sponge; and a method in which the liquid is added to a rinsing liquid after development and the liquid is dropped onto the plate surface of the photosensitive resin plate. When these methods are conducted before post-exposure, the methods may be conducted right after development or after development and drying. Alternatively, the post-exposure may be conducted while the liquid is attached.

When the liquid containing the ink-repellent component (A) and the curing component (B) is not added to the liquid developer, and is attached to the plate surface, the concentration of the liquid had better be higher than that in the case of being contained in the liquid developer because the attaching period of time is shorter, and is preferably 0.05 wt % to 50 wt %.

Thus, in the method in which the liquid containing the ink-repellent component (A) and the curing component (B) is brought into contact with the plate surface of the photosensitive resin plate, the above described method may be used solely or concomitantly with one or more other methods, regardless of the presence or absence of the ink-repellent component (A) and the curing component (B) in the liquid developer.

The post-exposure in the present embodiment means a treatment of exposing the plate surface of a photosensitive resin plate after having been developed at least to an active ray of light having a wavelength of 300 nm or less. It is reasonable to concomitantly use an active ray of light having a wavelength of 300 nm or more, as needed. When concomitantly using the active rays of light having different wavelengths, the exposure treatment may be conducted simultaneously or separately with the use of the active rays of light.

EXAMPLES

The present embodiment will now be described more specifically below with reference to examples and comparative examples, but the present embodiment is not limited to any of these examples and comparative examples.

Reference Example 1

Polymerizable compounds were added to a 100-mL glass polymerization ampoule, which were 6.80 g (56 parts by weight) of $C_nF_{2n+1}CH_2CH_2OCOCH=CH_2$ (wherein n is a mixture of an integer of 6 to 12 and the average thereof is 9: and is hereinafter referred to as "FA"); 4.4 g (36 parts by weight) of cyclohexyl methacrylate (hereinafter referred to as "CHMA", made by NIPPON SHOKUBAI CO., LTD. with a product name of "Cyclohexyl methacrylate"); 0.9 g (7 parts by weight) of triallyl cyanurate (hereinafter referred to as "TAC", made by Kayaku Akzo Corporation with a product name of "Triallyl cyanurate"); 0.22 g of 2,2-azobis (2-methyl butyronitrile) (made by Wako Pure Chemical Industries, LTD. with a product name of "V-59"); and 27.6 g of a hydrocarbon-based solvent containing an aromatic hydrocarbon-based solvent (made by Shell Chemicals Japan LTD. with a product name of "white spirit LAWS"); and the mixture was subjected to polymerization at 60° C. for 18 hours while having been shaken under nitrogen atmosphere.

As a result of having analyzed the obtained reaction liquid with gas chromatography (hereinafter referred to as "GC"), a raw material was not detected therein.

GC-2010 (product name, SHIMADZU CORPORATION) was used as the measurement instrument of GC, DB-1 (product name, Agilent Technologies, Inc.) as the column, and tetrahydrofuran as the solvent.

In addition, approximately 10 g of the obtained reaction liquid was dried on a water bath (80° C.), approximately 50 mg of the product was dissolved in approximately 1.0 ml of $CDCl_3$, and the liquid was subjected to measurement by $^1$H-NMR and $^{13}$C-NMR. As a result, the existence of an allyl group could be confirmed, which suggested that the fluorine-based ink-repellent component (A) was covalently bonded with the curing component (B) of the allyl group. The equivalent weight of the radical reactive groups was 3,300 g/mol, and the number average molecular weight was 12,500 (in terms of standard polystyrene) as a result of having been measured with gel permeation chromatography (hereinafter referred to as "GPC").

The reaction liquid was measured at an oven temperature of 40° C. while using LC-10 (product name, SHIMADZU CORPORATION) as the measurement instrument of GPC, two pieces of TSKgel GMHXL (4.6 mm ID×30 cm) as the column, and tetrahydrofuran (1.0 ml/min) as the solvent.

Reference Example 2

Polymerizable compounds were added to a 100-mL glass polymerization ampoule, which were: 7.0 g (58 parts by weight) of FA; 4.4 g (36 parts by weight) of CHMA; 0.7 g (6 parts by weight) of TAC; 0.24 g of V-59; and 27.6 g of white spirit LAWS; and the mixture was subjected to polymerization at 60° C. for 18 hours while having been shaken under nitrogen atmosphere.

As a result of having analyzed the obtained reaction liquid with GC on the same condition as that of Reference Example 1, a raw material was not detected therein. In addition, approximately 10 g of the obtained reaction liquid was dried on a water bath (80° C.), approximately 50 mg of the product was dissolved in approximately 1.0 ml of $CDCl_3$, and the liquid was subjected to measurement by $^1$H-NMR and $^{13}$C-NMR. As a result, the existence of an allyl group could be confirmed, which suggested that a fluorine-based ink-repellent component (A) was covalently bonded with a curing component (B) having the allyl group. The equivalent weight of the radical reactive groups was 4,600 g/mol, the number average molecular weight was 8,000 (in terms of standard polystyrene) as a result of having been measured with GPC on the same condition as that of Reference Example 1.

Reference Example 3

Polymerizable compounds were added to a 100-mL glass polymerization ampoule, which were: 6.8 g (56 parts by weight) of FA; 4.4 g (36 parts by weight) of CHMA; 0.22 g of V-59; and 27.6 g of white spirit LAWS; and the mixture was subjected to polymerization at 60° C. for 18 hours while having been shaken under nitrogen atmosphere.

As a result of having analyzed the obtained reaction liquid with GC on the same condition as that of Reference Example 1, a raw material was not detected therein. In addition, approximately 10 g of the obtained reaction liquid was dried on a water bath (80° C.), approximately 50 mg of the product was dissolved in approximately 1.0 ml of $CDCl_3$, and the liquid was subjected to measurement by $^1$H-NMR and $^{13}$C-NMR. As a result, the existence of a radical reactive group could not be confirmed.

Example 1

A cover sheet was peeled off from an unexposed photosensitive resin plate AFP-SH (product name, Asahi Kasei Chemicals Corporation, thickness of 1.14 mm, which contains thermoplastic elastomer having a number average molecular weight of 100,000 containing a polymer block that mainly contains styrene and a polymer block that mainly contains butadiene) of a solvent developing type; a negative film was closely contacted on a protection film layer on the photosensitive resin layer; and the whole surface was exposed with the light of 800 mJ/cm$^2$ from a supporting body side at first, by using an ultraviolet-light fluorescent lamp having a center wavelength of 370 nm on an AFP-1500 exposure unit (product name, Asahi Kasei Chemicals Corporation), and was then sequentially exposed to the light of 5,000 mJ/cm$^2$ through a negative film so as to form an image thereon. The exposure intensity used at this time was measured with the use of UV-35 filter of a UV illuminance meter MO-2 type instrument made by ORC MANUFACTURING CO., LTD. The intensity of an ultraviolet light emitted from a lamp in the bottom side that is a side of conducting back exposure, which was measured on a glass plate, was 4.0 mW/cm$^2$, and the measured intensity of an ultraviolet light emitted from a lamp in the top side which is a relief exposure side was 7.8 mW/cm$^2$.

The image of the used negative film contained dots of 1, 2, 3, 5, 10, 30, 50, 60, 70, 80, 90, 95% and a solid part in each line number of 100, 133 and 150 lpi.

Subsequently, the photosensitive resin plate was developed by using a mixture solution prepared by adding 0.3 wt % of the solution obtained in Reference Example 1 to solvit (product name, MacDermid Incorporated, an organic solvent of hydrocarbons) as a liquid developer and a quick line 912 developing machine (product name, Asahi Kasei Chemicals Corporation), at the liquid temperature of 30° C.

The plate was swelled by the liquid developer right after having been developed. Accordingly, the plate was dried at 60° C. for one hour before post-exposure, and the photosensitive resin plate for flexographic printing was obtained by subsequently post-exposing the whole plate surface with the light of 2,000 mJ/cm$^2$ with the use of an ALF-200UP post-exposure device (product name, Asahi Kasei Chemicals Corporation) and by using a germicidal lamp having a center wavelength of 254 nm, and subsequently post-exposing the plate to the light of 1,000 mJ/cm$^2$ by using an ultraviolet-light fluorescent lamp. Here, the post-exposure amount due to the germicidal lamp is a value calculated from the illuminance measured with the use of a UV-25 filter of an MO-2 type instrument (made by ORC MANUFACTURING CO., LTD.).

Example 2

A photosensitive resin plate for flexographic printing was obtained in a similar manner to that in Example 1, except that the liquid developer was changed to solvit, and the plate was subjected to a dry step, after a mixture solution prepared by adding 1 wt % of a solution obtained in Reference Example 1 to solvit was applied to the plate with a spray method right after development.

Example 3

A photosensitive resin plate for flexographic printing was obtained in a similar manner to that in Example 1, except that the liquid developer was changed to solvit, and the plate was subjected to post-exposure in a state of being immersed in ethanol/aqueous solution=1/9 (weight ratio) in which 0.3 wt % of a solution obtained in Reference Example 1 was dispersed.

Example 4

A flexographic resin plate was obtained in a similar manner to that in Example 1, except that the liquid developer was changed to a mixture solution prepared by adding 0.3 wt % of a solution obtained in Reference Example 2 to solvit, and afterward, the plate was subjected to a dry step.

Comparative Example 1

A photosensitive resin plate for flexographic printing was obtained in a similar manner to that in Example 1, except that the liquid developer was changed to solvit, and the plate was subjected to a dry step.

Comparative Example 2

A photosensitive resin plate for flexographic printing was obtained in a similar manner to that in Example 1, except that the liquid developer was changed to solvit, the plate was subjected to a dry step and a post-exposure step, and then a mixture solution prepared by adding 1 wt % of a solution obtained in Reference Example 1 to solvit was applied to the plate with a spray.

Comparative Example 3

A photosensitive resin plate for flexographic printing was obtained in a similar manner to that in Example 1, except that a mixture solution prepared by adding 0.3 wt % of a solution obtained in Reference Example 3 to solvit was used as a liquid developer.

Example 5

A photosensitive resin plate for flexographic printing was obtained in a similar manner to that in Example 1, except that a mixture solution prepared by adding 0.3 wt % of a solution obtained in Reference Example 3 and 0.007 wt % of TAC to solvit was used as a liquid developer.

Example 6

A photosensitive resin plate for flexographic printing was obtained in a' similar manner to that in Example 1, except that a mixture solution prepared by adding 0.3 wt % of a difunctional methacrylic-modified reactive silicone oil, X-22-164AS (product name, Shin-Etsu Chemical Co., Ltd., having an equivalent weight of functional group in an amount of 450 g/mol and molecular weight of 900) to solvit was used as a liquid developer.

Example 7

A photosensitive resin plate for flexographic printing was obtained in a similar manner to that in Example 1, except that a mixture solution prepared by adding 0.3 wt % of a difunctional methacrylic-modified reactive silicone oil, X-22-164A (product name, Shin-Etsu Chemical Co., Ltd., having an equivalent weight of functional group in an amount of 860 g/mol and molecular weight of 1,760) to solvit was used as a liquid developer.

Example 8

A photosensitive resin plate for flexographic printing was obtained in a similar manner to that in Example 1, except that a mixture solution prepared by adding 0.3 wt % of paraffin wax SP-0145 (product name, NIPPON SEIRO CO., LTD., a molecular weight of 410) and 0.009 wt % of TAC to solvit was used as a liquid developer.

Example 9

A photosensitive resin plate for flexographic printing was obtained in a similar manner to that in Example 1, except that the photosensitive resin was changed to a water-based developing type of AWP-EF (product name, Asahi Kasei Chemicals Corporation, thickness of 1.14 mm, which contains thermoplastic elastomer that has a number average molecular weight of 100,000 and contains a polymer block mainly containing styrene and a polymer block mainly containing butadiene); a mixture solution prepared by adding 0.3 wt % of the solution obtained in Reference Example 1 to a 6 wt % aqueous solution of W-300 (product name, Asahi Kasei Chemicals Corporation, a water-based liquid developer containing non-ionic-based surface active agent) was used as a liquid developer; and a machine was changed to a flat washing machine (made by ROBO DENSHI KENKYUSHO:KK).

Example 10

A photosensitive resin APR, F-320 (product name, Asahi Kasei Chemicals Corporation, which contains polyurethane-based polymer component) which was liquid at 20° C., was sandwiched between a cover film CF-82 (product name, Asahi Kasei Chemicals Corporation) and a base film (product name, Asahi Kasei Chemicals Corporation) on ALF-213E exposure unit (product name, Asahi Kasei Chemicals Corporation) so as to form the thickness of 2.84 mm, and the whole surface was exposed with the light of 150 mJ from a base film side. Then, a negative film was arranged in the outer side of the cover film, and the photosensitive resin was exposed with the light of 500 mJ/cm² through the negative film to have formed the image therein. The exposure intensity at this time was measured with the use of UV-35 filter in a UV illuminance meter MO-2 type instrument made by ORC MANUFACTURING CO., LTD. The image of the used negative film contained dots of 3, 10, 30, 50, 60, 70, 80, 90, 95% and a solid part in each line number of 30, 45, 65 and 100 lpi. The cover film was removed, an unexposed portion was collected, and then, the plate was washed with the use of a washing machine AL-400W (product name, Asahi Kasei Chemicals Corporation) and by using a mixture solution prepared by adding 0.3 wt % of X-22-164AS (product name, Shin-Etsu Chemical Co., Ltd., having an equivalent weight of functional group in amount of 450 g/mol and molecular weight of 900) to 2 wt % aqueous solution of a washing liquid W-10 (product name, Asahi Kasei Chemicals Corporation, and is water-based liquid developer containing anionic-based surface active agent), as a liquid developer. A target photosensitive resin plate for flexographic printing was obtained by subjecting the obtained photosensitive resin plate to post-exposure in water by using a chemical lamp and a germicidal lamp with the use of a post-exposure device ALF-200UP (product name, Asahi Kasei Chemicals Corporation).

Comparative Example 4

A photosensitive resin plate for flexographic printing was obtained in a similar manner to that in Example 1, except that a mixture solution prepared by adding 0.3 wt % of an unmodified silicone oil KF-96-100CS (product name, Shin-Etsu Chemical Co., Ltd.) to solvit was used as a liquid developer.

Comparative Example 5

A photosensitive resin plate for flexographic printing was obtained in a similar manner to that in Example 1, except that a mixture solution prepared by adding 0.3 wt % of a difunctional phenol-modified silicone oil X-22-1821 (product name, Shin-Etsu Chemical Co., Ltd. having a molecular weight of 2,950) to solvit was used as a liquid developer.

Comparative Example 6

A photosensitive resin ADS-60 (product name, Asahi Kasei Chemicals Corporation, which contains polyurethane resin) which was liquid at 20° C., was formed into a sheet shape with the thickness of 2.8 mm on a PET film, and the photosensitive resin was irradiated with ultraviolet light of a high-pressure mercury lamp from the surface at which a photosensitive resin layer was exposed to the atmosphere. The irradiation energy was 4,000 mJ/cm². The exposure intensity at this time was measured with the use of UV-35 filter in a UV illuminance meter MO-2 type instrument made by ORC MANUFACTURING CO., LTD. A flexographic printing plate was obtained by engraving a pattern on the photo-cured photosensitive resin layer with the use of a laser engraving device made by ZED Instruments (of which product name is "ZED-Mini").

Example 11

A flexographic printing plate was obtained by applying a mixture solution prepared by adding 1 wt % of a solution obtained in Reference Example 1 to solvit to the flexographic printing plate obtained in Comparative Example 6 with a spray, and then post-exposing the whole plate surface with the light of 2,000 mJ/cm² with the use of an ALF-200UP post-exposure device (product name, Asahi Kasei Chemicals Corporation) and by using a germicidal lamp having a center wavelength of 254 nm, and subsequently post-exposing the plate to the light of 1,000 mJ/cm² by using an ultraviolet-light fluorescent lamp.

Evaluation Method (a) Evaluation of Plate Surface Blemish by Actual Printing

A plate surface blemish was evaluated by actual printing with the use of an obtained photosensitive resin plate for flexographic printing. An AI-3 type flexographic printing machine (IYO KIKAI SEISAKUSHO Co., Ltd.) was employed, a solvent type of FB king (indigo blue, TOYO INK MFG. CO., LTD.) was used as ink, and low-density polyethylene was used as a substrate. Fifty thousand copies were printed at a rate of 200 m/min while using an anilox roll (with cell volume of 3.8 cm³/m²) of 800 lpi, and 3M 1020 (product name, 3M) as a cushion tape. The image of the negative film used when a photosensitive resin plate for flexographic printing to be evaluated was produced contained dots of 1, 2, 3, 5, 10, 30, 50, 60, 70, 80, 90, 95% and a solid part in each line number of 100, 133 and 150 lpi. A case of having caused a plate surface blemish particularly on a dot part before printing is finished and having needed to stop printing was evaluated as "C", a case of having caused the decrease of a solid density and an expansion of a dot part though printing could have been finished was evaluated as "B", and a case of having caused no decrease of the solid density and no expansion of the dot part, of which the printing could have been finished, was evaluated as "A". A, B and C are preferable in this order.

(b) Evaluation of Ink-Repellent Properties

Contact angles on a solid part of the obtained photosensitive resin plate for flexographic printing and flexographic printing plate were measured with a droplet method that uses a solid-liquid interface analyzer DropMaster500 (product name, Kyowa Interface Science Co., Ltd.). The contact angle was automatically measured by leaving the plate in a steady temperature and humidity room of a temperature of 23° C. and a relative humidity of 50% for one day, and then using "FAMAS ver1.8.1" as an analysis software, diiodine methane (KANTO CHEMICAL CO.,INC.) as a probe solution, and 22G (Kyowa Interface Science Co., Ltd.) made from stainless steel as a needle, after 15 seconds after diiodine methane discharged for 100 ms at a voltage of 4,000 mv was contacted with the plate, and the value was recorded. Table 1 shows the contact angle in a solid part of the resin plate in each Example and each Comparative Example.

(c) Evaluation for Sustainability of Ink-Repellent Properties

Sustainability described here means durability against a solvent and a UV ink as will be described below, and respective ink-repellent properties of a photosensitive resin plate for flexographic printing were evaluated according to a method (b).

(c-1) Solvent Ink Dipping Test

The prepared photosensitive resin plate for flexographic printing was dipped in a solvent of ethyl acetate/isopropyl alcohol=20/80 (weight ratio) at 20° C. for four hours, was subsequently dried at 60° C. for four hours or longer, and was then further left in a steady temperature and humidity room of a temperature of 23° C. and a relative humidity of 50% for one day. Then, the contact angle of the prepared photosensitive resin plate for flexographic printing was evaluated.

(c-2) UV-Ink Dipping Test

The prepared photosensitive resin plate for flexographic printing was dipped in a flexographic UV ink UFL639 indigo blue (product name, INCTEC INC.) at 20° C. for four hours, and then, the ink was washed with the use of isopropyl alcohol. The photosensitive resin plate for flexographic printing was dried at 60° C. for four hours, and further was subsequently left in a steady temperature and humidity room of a temperature of 23° C. and a relative humidity of 50% for one day. Then, the contact angle of the photosensitive resin plate for flexographic printing was evaluated.

(d) Evaluation for Paper-Powder Releasing Properties

In order to evaluate paper-powder releasing properties in printing, the obtained photosensitive resin plate for flexographic printing was subjected to a printing operation on the following printing condition, and the releasing properties thereof were evaluated.

An AI-3 type flexographic printing machine (made by IYO KIKAI SEISAKUSHO Co., Ltd.) was used, HW571AQP (product name, TOYO INK MFG. CO., LTD.) was used as an aqueous ink, and a coated paper pearl coat (product name, Oji Paper Co., Ltd.) was used as a substrate. The printing operation was carried out at a printing speed of 100 m/min, while using an anilox roll of 600 lpi (cell volume of 3.8 cm³/m²), and 3M1020 (product name, 3M) as a cushion tape.

When the printing speed reached 100 m/min, 0.5 g of the coated paper pearl coat which was cut into a width of 0.1 to 2.0 mm and a length of 0.1 to 2.0 mm was scattered on the substrate to have been forcibly brought into contact with the plate surface, and after three minutes, the number of the paper powder on the printed matter was visually measured.

The image of the negative film which was used in the production of the photosensitive resin plate for flexographic printing to be evaluated had a solid part with the size of 100×150 mm. When the number of the paper powder measured in this solid part area was 50 pieces or more, the releasing properties were evaluated to be X, when the measured number of the paper powder was 20 to 50 pieces, the releasing properties were evaluated to be Δ, when the measured number of the paper powder was 5 to 20 pieces, the releasing properties were evaluated to be ○, and when the measured number of the paper powder was 5 or less, the releasing properties were evaluated to be ◎. The measured paper powder is a printing failure, so that Δ is preferable to X, ○ to Δ, and ◎ to ○.

Table 1 shows the evaluation results of each (a) to (d) on Examples 1 to 11 and Comparative Examples 1 to 6.

TABLE 1

| | Ink-repellent component | Equivalent weight of radical reactive group (g/mol) | Curing component | Application method | Evaluation (a) | Evaluation (b) | Evaluation (c-1) | Evaluation (c-2) | Evaluation (d) |
|---|---|---|---|---|---|---|---|---|---|
| Ex. 1 | Fluorine-based | 3300 | Contained (covalent bond with ink-repellent component) | In development | A | 75 | 68 | 68 | ◎ |
| Ex. 2 | Fluorine-based | 3300 | Contained (covalent bond with ink-repellent component) | Application prior to post-exposure | A | 75 | 67 | 68 | ◎ |

TABLE 1-continued

| | Ink-repellent component | Equivalent weight of radical reactive group (g/mol) | Curing component | Application method | Evaluation (a) | Evaluation (b) | Evaluation (c-1) | Evaluation (c-2) | Evaluation (d) |
|---|---|---|---|---|---|---|---|---|---|
| Ex. 3 | Fluorine-based | 3300 | Contained (covalent bond with ink-repellent component) | In post-exposure | A | 74 | 68 | 67 | ◎ |
| Ex. 4 | Fluorine-based | 4600 | Contained (covalent bond with ink-repellent component) | In development | A | 71 | 55 | 60 | ○ |
| Ex. 5 | Fluorine-based | 15350 | Contained | In development | A | 70 | 62 | 54 | ○ |
| Ex. 6 | Methacrylic-modified silicone | 450 | Contained (covalent bond with ink-repellent component) | In development | A | 70 | 59 | 57 | ○ |
| Ex. 7 | Methacrylic-modified silicone | 860 | Contained (covalent bond with ink-repellent component) | In development | A | 70 | 58 | 58 | ○ |
| Ex. 8 | Paraffin-based | 2850 | Contained | In development | A | 61 | 51 | 54 | ○ |
| Ex. 9 | Fluorine-based | 3300 | Contained (covalent bond with ink-repellent component) | In development | A | 74 | 68 | 67 | No evaluation |
| Ex. 10 | Methacrylic-modified silicone | 450 | Contained (covalent bond with ink-repellent component) | In development | No evaluation | 70 | 58 | 58 | No evaluation |
| Ex. 11 | Fluorine-based | 3300 | Contained (covalent bond with ink-repellent component) | In development | No evaluation | 98 | 72 | 74 | No evaluation |
| Com. Ex. 1 | None | — | None | — | C | 49 | 44 | 42 | X |
| Com. Ex. 2 | Fluorine-based | 3300 | Contained (covalent bond with ink-repellent component) | Application after post-exposure | B | 68 | 48 | 47 | Δ |
| Com. Ex. 3 | Fluorine-based | — | None | In development | B | 62 | 51 | 52 | Δ |
| Com. Ex. 4 | Non-modified silicone | — | None | In development | C | 65 | 45 | 47 | Δ |
| Com. Ex. 5 | Phenol-modified silicone | — | None | In development | C | 65 | 47 | 47 | Δ |
| Com. Ex. 6 | None | — | None | — | No evaluation | 71 | 49 | 49 | No evaluation |

\* Evaluation (a) evaluation of plate surface blemish by actual printing: A is the case of having caused no decrease of the solid density and no expansion of the dot part, of which the printing could have been finished, B is the case of having caused the decrease of a solid density and an expansion of a dot part though printing could have been finished, and C is the case of having caused the entanglement of ink particularly on a dot part before printing has been finished, and having needed to stop printing.
\* Evaluation (b) evaluation of ink-repellent properties
\* Evaluation (c-1) evaluation for sustainability of ink-repellent properties
\* Evaluation (c-2) evaluation for sustainability of ink-repellent properties
\* Evaluation (d) evaluation of adherability of paper powder From a result of Table 1, it was confirmed that when the solution containing the ink-repellent component (A) and the curing component (B) is attached to the plate surface of the photosensitive resin plate or the relief printing plate before the post-treatment step in the process according to the present invention, and in the case where the ink-repellent component (A) contains at least one compound selected from the group consisting of the silicon-based compounds, the fluorine-based compounds and the paraffin-based compounds, the printing plate shows an effect of preventing the plate surface blemish.

In addition, when the solution containing the ink-repellent component (A) and the curing component (B) is attached to the printing plate before the post-treatment step, and in the case where the ink-repellent component (A) contains at least one compound selected from the group consisting of the silicon-based compounds, the fluorine-based compounds and the paraffin-based compounds, the photosensitive resin plate or the relief printing plate enables the production of the paper powder to be inhibited and a printing operation to be adequately conducted.

The present embodiment was described in detail with reference to particular aspects, but it is obvious to those skilled in the art that the present invention can be subjected to various changes and modifications without departing from the spirit and the scope thereof.

This application is based on Japanese patent application (Japanese Patent Application No. 2007-73249) which was filed with Japan Patent Office on Mar. 20, 2007, which is hereby incorporated by reference herein.

INDUSTRIAL APPLICABILITY

The present invention can provide a treatment liquid which is preferable for preventing the plate surface blemish, and can provide the photosensitive resin plate or the relief printing plate having the recessed and projected pattern.

The invention claimed is:

1. A process for producing a photosensitive resin plate having a recessed and projected pattern or a relief printing plate having a recessed and projected pattern, the process comprising the steps of: making a solution containing an ink-repellent component (A) and a curing component (B) attach to a plate surface of the photosensitive resin plate or the relief printing plate having a recessed and projected pattern; and subjecting the printing plate to post-treatment, wherein the post-treatment step is treatment selected from the group consisting of heat treatment, post-exposure treatment with an active light source, and electron beam treatment; and the ink-repellent component (A) comprises at least one fluorine-based compound, the curing component (B) comprises radical reactive groups, and an equivalent weight of the radical reactive groups in the ink-repellent component (A) and the curing component (B) is 3,500 g/mol or less, wherein the radical reactive groups are allyl groups.

2. A process for producing a relief printing plate having a recessed and projected pattern, the process comprising the steps of exposing, developing and post-treating, wherein the post-treatment step is treatment selected from the group consisting of heat treatment, post-exposure treatment with an active light source, and electron beam treatment, further comprising making a solution containing an ink-repellent component (A) and a curing component (B) attach to the plate surface of the relief printing plate prior to the post-treatment step or during the post-treatment step, wherein the ink-repellent component (A) comprising at least one fluorine-based compound, the curing component (B) comprises radical reactive groups, and an equivalent weight of the radical reactive groups in the ink repellent component (A) and the curing component (B) is 3,500 g/mol or less, wherein the radical reactive groups are allyl groups.

3. The process according to claim 2, wherein the post-treatment step is post-exposure treatment, further comprising making the solution containing the ink-repellent component (A) and the curing component (B) attach to a plate surface of the relief printing plate prior to the post-exposure treatment or in the post-exposure step, wherein the ink-repellent component (A) also contains at least one compound selected from the group consisting of silicon-based compounds, and paraffin-based compounds.

4. The process according to any one of claims 1 and 2, wherein the curing component (B) has at least two or more radical reactive groups in one molecule.

5. The process according to any one of claims 1 and 2, wherein the curing component (B) has at least 3 or more radical reactive groups in one molecule.

6. The process according to any one of claims 1 and 2, wherein the ink-repellent component (A) is copolymerized with the curing component (B).

7. The process according to any one of claims 1 and 2, wherein the ink-repellent component (A) is copolymerized with the curing component (B), the curing component (B) has at least 2 or more radical reactive groups in one molecule, and the equivalent weight of the radical reactive groups in the ink-repellent component (A) and the curing component (B) is 5,000 g/mol or less.

8. The process according to any one of claims 1 and 2, wherein the ink-repellent component (A) is copolymerized with the curing component (B), the curing component (B) has at least 2 or more radical reactive groups, and the equivalent weight of the radical reactive group is 3,500 g/mol or less.

9. The process according to any one of claims 1 and 2, wherein a number average molecular weight of the ink-repellent component (A) is 5,000 or more.

10. The process according to any one of claims 1 and 2, wherein the relief printing plate comprises a block copolymer containing at least a first polymer block that mainly contains a conjugated diene and a second polymer block that mainly contains a vinyl aromatic hydrocarbon.

11. The process according to any one of claims 1 and 2, wherein the solution further comprises a radical initiator (C).

12. The process according to claim 2, wherein the developing step uses a solution which contains the ink-repellent component (A) and the curing component (B).

13. The process according to claim 2, wherein the developing step is a base material contact developing step, and the base material contains the ink-repellent component (A) and the curing component (B).

14. The process according to claim 2, wherein the solution containing the ink-repellent component (A) and the curing component (B) is made attach to a plate surface of the relief printing plate after the developing step and before the post-treatment step.

15. The process according to any one of claims 1 and 2, further comprising conducting a post-treatment step while bringing the solution containing the ink-repellent component (A) and the curing component (B) into contact with the relief printing plate.

16. The process according to claim 12, wherein the solution comprises an organic solvent.

* * * * *